(12) United States Patent
Sarferaz

(10) Patent No.: US 12,014,248 B2
(45) Date of Patent: Jun. 18, 2024

(54) MACHINE LEARNING PERFORMANCE AND WORKLOAD MANAGEMENT

(71) Applicant: SAP SE, Walldorf (DE)

(72) Inventor: Siar Sarferaz, Heidelberg (DE)

(73) Assignee: SAP SE, Walldorf (DE)

( * ) Notice: Subject to any disclaimer, the term of this patent is extended or adjusted under 35 U.S.C. 154(b) by 1004 days.

(21) Appl. No.: 16/460,311

(22) Filed: Jul. 2, 2019

(65) Prior Publication Data

US 2021/0004712 A1 Jan. 7, 2021

(51) Int. Cl.
| | |
|---|---|
| *G06N 20/00* | (2019.01) |
| *G06F 9/54* | (2006.01) |
| *G06F 30/27* | (2020.01) |
| *G06N 5/04* | (2023.01) |
| *H04L 41/16* | (2022.01) |

(52) U.S. Cl.
CPC ............ *G06N 20/00* (2019.01); *G06F 9/54* (2013.01); *G06F 30/27* (2020.01); *G06N 5/04* (2013.01); *H04L 41/16* (2013.01)

(58) Field of Classification Search
CPC .......... G06N 20/00; G06N 5/04; G06F 30/27; G06F 9/54; H04L 41/16
USPC ........................................................ 706/12
See application file for complete search history.

(56) References Cited

U.S. PATENT DOCUMENTS

| | | | | |
|---|---|---|---|---|
| 8,595,154 | B2 * | 11/2013 | Breckenridge | G06N 20/00 706/12 |
| 10,412,155 | B2 * | 9/2019 | Kumar | G06F 9/5088 |
| 10,949,353 | B1 * | 3/2021 | Tighe | G06F 12/0868 |
| 2015/0379424 | A1 * | 12/2015 | Dirac | G06N 20/00 706/12 |
| 2018/0165580 | A1 * | 6/2018 | Boyer | G06F 16/00 |
| 2018/0341495 | A1 * | 11/2018 | Culurciello | G06F 9/3895 |
| 2019/0095817 | A1 * | 3/2019 | Ma | H04L 63/1416 |
| 2019/0340940 | A1 * | 11/2019 | Elkabetz | G08G 5/0065 |
| 2020/0074318 | A1 * | 3/2020 | Chen | G06N 3/084 |
| 2020/0159205 | A1 * | 5/2020 | Maidment | G06F 9/5077 |

OTHER PUBLICATIONS

Xu, M. et al., "DeepCache: principled cache for deep mobile vision," MobiCom'18 (Oct. 2018) pp. 129-144. (Year: 2018).*

* cited by examiner

*Primary Examiner* — Brian M Smith
(74) *Attorney, Agent, or Firm* — SCHWEGMAN LUNDBERG & WOESSNER, P.A.

(57) ABSTRACT

Reducing resource consumption of a database system and a machine learning (ML) system is described. Data is received from a ML application of a database system. The data includes a first inference call for a predicted response to the received data. The first inference call is a request to a ML model to generate one or more predictions for which a response is unknown. A ML model using the received data generates an output comprising the predicted response to the data. The output for future inference calls is cached in an inference cache so as to bypass the ML model. The generated output to the ML application is provided by the ML model. A second inference call is received which includes the data of the first inference call. The cached output is retrieved from the inference cache. The retrieving bypasses the ML model.

19 Claims, 14 Drawing Sheets

710

```
create local temporary column table #pal_parameter_tbl (
        "PARAM_NAME" varchar (100),
        "INT_VALUE" integer,
        "DOUBLE_VALUE" double,
        "STRING_VALUE" varchar (100)
);
insert into #pal_parameter_tbl values ('TREES_NUM', 10, null, null);
insert into #pal_parameter_tbl values ('SPLIT_THRESHOLD', null, 1e-3, null);
insert into #pal_parameter_tbl values ('SEED', 2, null, null);
insert into #pal_parameter_tbl values ('CALCULATE_OOB', 0, null, null);
insert into #pal_parameter_tbl values ('NODE_SIZE', 50, null, null);
insert into #pal_parameter_tbl values ('THREAD_RATIO', null, 0.9, null);
```

720

```
call _sys_afl.pal_random_decision_trees ("SAPR3"."airline2008_label_no_null",
#pal_parameter_tbl, ?, ?, ?, ?)
```

730

```
alter system alter configuration('global.ini', 'SYSTEM') SET ('resource_tracking',
'enable_tracking') ='true' with reconfigure;
alter system alter configuration('global.ini', 'SYSTEM') SET ('resource_tracking',
'memory_tracking') ='true' with reconfigure;
```

740

```
create workload class "TIMEOUT_10" set 'STATEMENT TIMEOUT' = '10';
create workload class "THREAD_LIMIT_2" set 'STATEMENT THREAD LIMIT'='2';
create workload class "MEMORY_LIMIT_1GB" set 'STATEMENT MEMORY LIMIT' = '1';
select * from workload_classes;
```

750

```
create workload mapping "TIMEOUT_MAPPING" workload class "TIMEOUT_10" set 'USER NAME' =
'SAPR3';
```

760

```
call _sys_afl.pal_random_decision_trees_new ("SAPR3"."airline2008_label_no_null",
#pal_parameter_tbl, ?, ?, ?, ?);
```

FIG. 7

```
900 job:
  name: "test"
  execution:
    image: "tensorflow/tensorflow:1.4.0-gpu"
    command: "python -c 'import tensorflow as tf;
                        x=tf.placeholder(tf.float32,[None]); y=x*2;
                        print(tf.Session().run(y,{x:[2,3]}))'"
    completionTime: "1h"
    resources:
      cpus: 1
      memory: 8192 # Mb
      gpus: 1
```

FIG. 9

MACHINE LEARNING PERFORMANCE AND WORKLOAD MANAGEMENT

TECHNICAL FIELD

The subject matter described herein relates to enhanced techniques for training of machine learning models.

BACKGROUND

Machine learning (ML) can be used in a variety of applications. Use cases like forecasting, key influencers, and trending can be solved with classic algorithms like regression, clustering, classification or time series analysis. Such algorithms are not resource intensive in terms of memory consumption and central processing unit (CPU) processing time. Use cases like image recognition, sentimental analysis, or natural language processing require deep learning algorithms based on neuronal networks (e.g., ML algorithms). For model training, usually these kinds of algorithms demand a large volume of data and/or increased CPU processing time. Requested data such as images, audio files, text documents, historical data, and/or application logs may not be stored within an in-memory database but rather on a big data solution, requiring interaction between an in-memory database and a big data solution using ML. Training for ML models can result in intensive consumption of system resources. Additionally, such training can affect the performance of transaction processes.

SUMMARY

In one aspect, resource consumption of a database system and a ML system is reduced by receiving, from a ML application of a database system, data having a first inference call for a predicted response to the received data. The first inference call is a request to a ML model to generate one or more predictions for which a response is unknown. A ML model using the received data generates an output comprising the predicted response to the data. The output is cached in an inference cache for future inference calls so as to bypass the ML model. The ML model provides the generated output to the ML application. A second inference call is received which includes the data of the first inference call. The cached output is retrieved from the inference cache and bypasses the ML model.

In some variations, the ML model can be imported by the database system from a ML system. The ML system can be a different computing device than the database system. The output can be generated after the importing such that the generating occurs within the database system.

In other variations, the ML model can be trained by a ML system and the ML system includes the ML model and the inference cache.

In some variations, the ML model can be trained by a ML system. The ML system can include the ML model, and the database system can include the inference cache.

In other variations, the ML application can generate data having a plurality of inference calls for a plurality of predicted response to the data. An application programming interface can combine the plurality of inference calls into a single bulk call. The database system can include the API and the API can provide the single bulk call to the ML model.

In some variations, the received data can be received by an inference server of a ML learning system. In other variations, an application programming interface can provide the first inference call and the second inference call to the inference server.

In other variations, the database system is an in-memory database system.

In another aspect, a system for reducing resource consumption of a database system and a ML system includes at least one data processor and memory storing instructions, which when executed by at least one data processor, result in operations including receiving, from a ML application of a database system. The data includes a first inference call for a predicted response to the received data. The first inference call is a request to a ML model to generate one or more predictions for which a response is unknown. A ML model using the received data generates an output including the predicted response to the data. The output is cached in an inference cache for future inference calls so as to bypass the ML model. The ML model provides the generated output to the ML application. A second inference call is received which includes the data of the first inference call. The cached output is retrieved from the inference cache and bypasses the ML model.

In yet another aspect, a method for reducing resource consumption of a database system with an embedded ML application includes receiving, by the embedded ML application, data having an inference call for a predicted response to the received data. The inference call is a request to a ML model to generate one or more predictions for which a response is unknown and the inference call comprises session context data. A workload class is determined which specifying an amount of system resources available for execution of the background job. The inference call is mapped to a workload class based on the session context data. Training of the embedded ML application is executed, as a background job based on the workload class, at predetermined frequency. A number of background jobs running in parallel with the training is minimized. The trained embedded ML application using the received data generates an output comprising the predicted response to the data.

In some variations, the session context data includes at least one of an application name, an application user name, or a database user name.

In other variations, the execution of the training is scheduled by receiving, by a scheduling application of the database system, a task generated by a user, the task having an associated amount of system resources required for execution of the task. An entry is generated, by the scheduling application, in a queue table having a first status, the queue table have a plurality of entries. Each entry of the plurality of entries is evaluated by the scheduling application of the queue table for the first status. The execution of the number of parallel background jobs running in parallel is minimized based on the associated amount of system resources required for execution of the task and a current available amount of system resources.

In some variations, the database system is an in-memory database system.

Non-transitory computer program products (i.e., physically embodied computer program products) are also described that store instructions, which when executed by one or more data processors of one or more computing systems, cause at least one data processor to perform operations herein. Similarly, computer systems are also described that may include one or more data processors and memory coupled to the one or more data processors. The memory may temporarily or permanently store instructions that cause at least one processor to perform one or more of the operations described herein. In addition, methods can be implemented by one or more data processors either within a single computing system or distributed among two or more computing systems. Such computing systems can be connected and can exchange data and/or commands or other instructions or the like via one or more connections, including but not limited to a connection over a network (e.g., the Internet, a wireless wide area network, a local area network, a wide area network, a wired network, or the like), via a direct connection between one or more of the multiple computing systems, etc.

The subject matter described herein provides many technical advantages. For example, the current subject matter provides ML functionality within in-memory database systems. Use of this subject matter can improve processing power and/or provide better algorithms for combining ML models with an in-memory database. Combining ML with in-memory database systems can facilitate consumption of intelligent services along with training and deploying ML models within an intelligent service.

The details of one or more variations of the subject matter described herein are set forth in the accompanying drawings and the description below. Other features and advantages of the subject matter described herein will be apparent from the description and drawings, and from the claims.

DESCRIPTION OF DRAWINGS

FIG. 7 illustrates example coding of how workload classes are applied on an embedded ML algorithm;

FIG. 9 illustrates example code for configuring resource consumption;

Like reference symbols in the various drawings indicate like elements.

DETAILED DESCRIPTION

Figure 1:
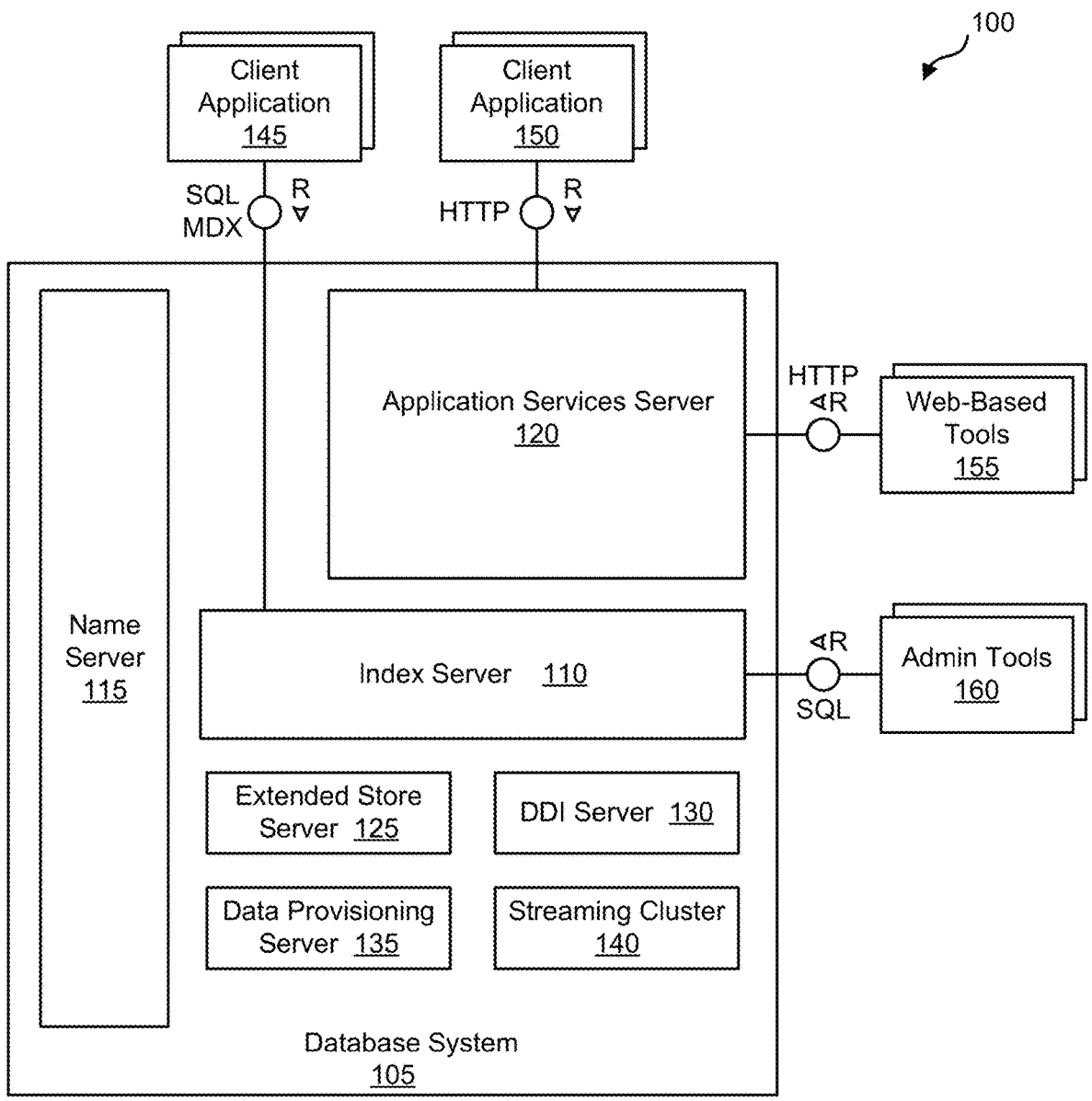
FIG. 1 is a system diagram illustrating an example database system for use in connection with the current subject matter.

ML training can consume large amounts of memory, CPU-time, and/or disk space. Such consumption can be minimized with workload and quota management (e.g actions that optimize computing infrastructure resources such as memory, CPU-time, and/or disk space to maintain or improve performance and/or throughput). Such management can include rescheduling, moving, technical virtualization, and/or limiting of a particular service and/or workload. For example, an administrator can be enabled to set limits for jobs concerning CPU-time and memory consumption. For successful workload and quota management, ongoing diligent monitoring may be necessary. In the context of ML, typically quota management is not relevant because during embedded ML training, the application data can be read in real-time from an in-memory database. Additionally, for side-by-side ML training application data from an in-memory database can be temporarily replicated to a ML application. Read access of training data can be optimized using a packing and pipelining mechanism. In other words, reading of the training data does not need to occur all at once as this could result in out-of-memory issues, but rather such data can be processed in packages by the training process.

The process of training a ML model involves providing a ML algorithm with training data from which the ML model can learn. A ML model is a model artifact that is created by the training process. The training data contains the correct answer, which is known as a target or target attribute. The learning algorithm finds patterns in the training data that map the input data attributes to the target (the answer to be predicted), and it outputs a ML model that captures these patterns. ML training is usually an asynchronous process which is performed yearly, monthly or weekly. Performance (e.g., the total effectiveness of a system including throughput, individual response time, and availability) is not critical but the allocation of memory, CPU-time, and disk space can be critical.

Inference is the process of using the ML model to get predictions on new data for which the target is not known. For example, a ML model is trained to predict if an email is spam or not spam. In this case, a ML model can be provided with training data that contains emails for which the target is known (e.g., label that identifies whether an email is spam or not spam). A ML model can be trained by using such data, resulting in a model that attempts to predict whether new email will be spam or not spam. Usually for inference, the focus is on performance while memory, CPU-time and disk space are negligible.

Embedded ML can impact performance of an in-memory database. To avoid such impacts, end-to-end response time for consumption of ML model should below approximately one second as ML capabilities are integrated into transactional processes and user interfaces. Additionally, ML training should minimally impact performance of transactional processes caused by inadequate allocation of memory, CPU-time and/or disk space.

FIG. 1 is a diagram 100 illustrating a database system 105 that can be used to implement aspects of the current subject matter. The database system 105 can, for example, be an in-memory database in which all relevant data is kept in main memory so that read operations can be executed without disk input output (I/O) and in which disk storage is required to make any changes durable. The database system 105 can include a plurality of servers including, for example, one or more of an index server 110, a name server 115, and/or an application server 120. The database system 105 can also include one or more of an extended store server 125, a database deployment infrastructure (DDI) server 130, a data provisioning server 135, and/or a streaming cluster 140. The database system 105 can be accessed by a plurality of remote clients 145, 150 via different protocols such as SQL/MDX (by way of the index server 110) and/or web-based protocols such as HTTP (by way of the application server 120).

The index server 110 can contain in-memory data stores and engines for processing data. The index server 110 can also be accessed by remote tools (via, for example, SQL queries), that can provide various development environment and administration tools. Additional details regarding an example implementation of the index server 110 is described and illustrated in connection with diagram 300 of FIG. 3.

The name server 115 can own information about the topology of the database system 105. In a distributed database system, the name server 115 can know where various components are running and which data is located on which server. In a database system 105 with multiple database containers, the name server 115 can have information about existing database containers and it can also host the system database. For example, the name server 115 can manage the information about existing tenant databases. Unlike a name server 115 in a single-container system, the name server 115 in a database system 105 having multiple database containers does not store topology information such as the location of tables in a distributed database. In a multi-container database system 105 such database-level topology information can be stored as part of the catalogs of the tenant databases.

The application server 120 can enable native web applications used by one or more remote clients 150 accessing the database system 105 via a web protocol such as HTTP. The application server 120 can allow developers to write and run various database applications without the need to run an additional application server. The application server 120 can also be used to run web-based tools 155 for administration, life-cycle management, and development. Other administration and development tools 160 can directly access the index server 110 for, example, via SQL and other protocols.

The extended store server 125 can be part of a dynamic tiering option that can include a high-performance disk-based column store for very big data up to the petabyte range and beyond. Less frequently accessed data (for which is it non-optimal to maintain in main memory of the index server 110) can be put into the extended store server 125. The dynamic tiering of the extended store server 125 allows for hosting of very large databases with a reduced cost of ownership as compared to conventional arrangements.

The DDI server 130 can be a separate server process that is part of a database deployment infrastructure (DDI). The DDI can be a layer of the database system 105 that simplifies the deployment of database objects using declarative design time artifacts. DDI can ensure a consistent deployment, for example by guaranteeing that multiple objects are deployed in the right sequence based on dependencies, and by implementing a transactional all-or-nothing deployment.

The data provisioning server 135 can provide enterprise information management and enable capabilities such as data provisioning in real time and batch mode, real-time data transformations, data quality functions, adapters for various types of remote sources, and an adapter software development kit (SDK) for developing additional adapters.

The streaming cluster 140 allows for various types of data streams (i.e., data feeds, etc.) to be utilized by the database system 105. The streaming cluster 140 allows for both consumption of data streams and for complex event processing.

Figure 2:
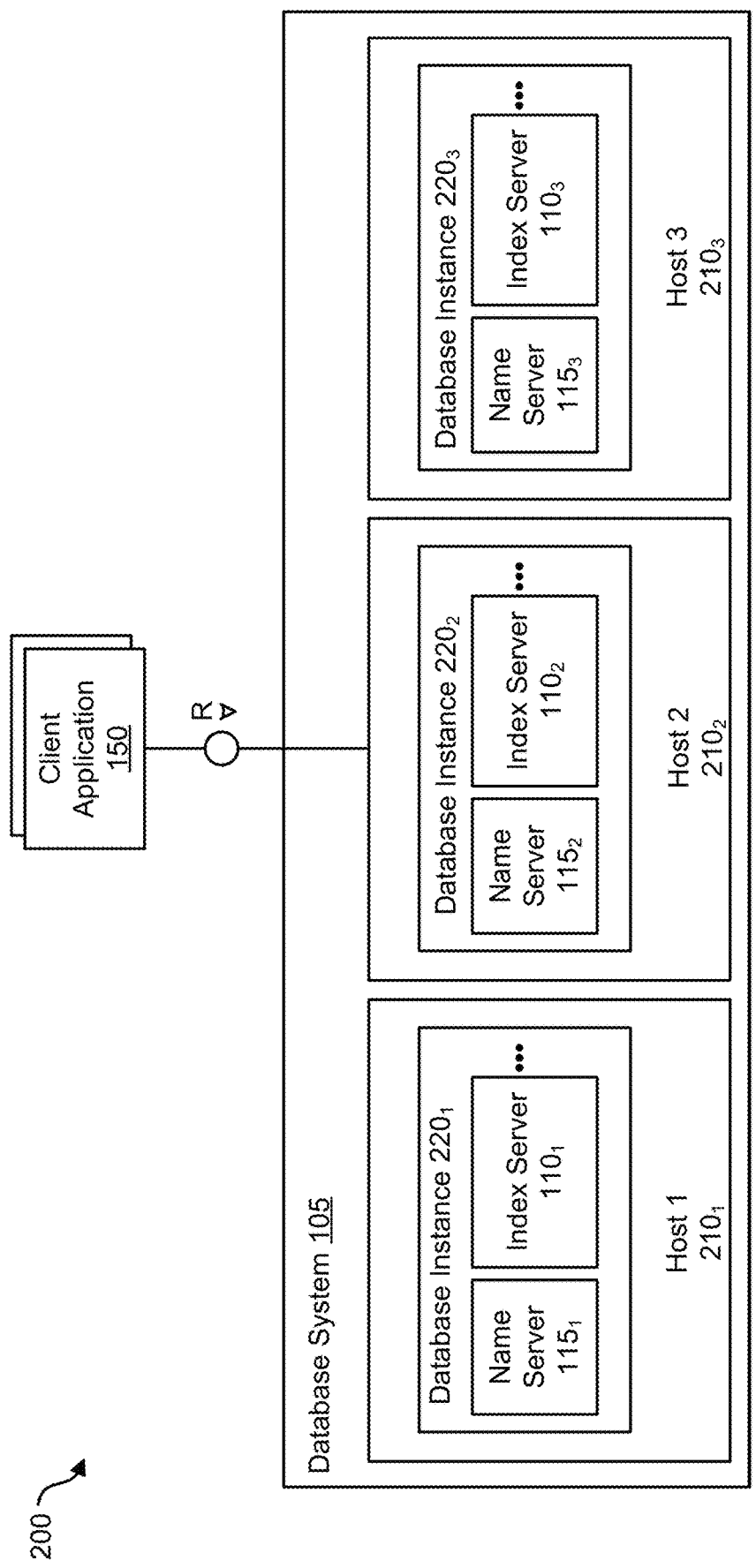
FIG. 2 is a system diagram illustrating an example database system that can support distribution of server components across multiple hosts for scalability and/or availability purposes for use in connection with the current subject matter.

FIG. 2 is a diagram 200 illustrating a variation of the database system 105 that can support distribution of server components across multiple hosts for scalability and/or availability purposes. This database system 105 can, for example, be identified by a single system ID (SID) and it is perceived as one unit from the perspective of an administrator, who can install, update, start up, shut down, or backup the system as a whole. The different components of the database system 105 can share the same metadata, and requests from client applications 150 can be transparently dispatched to different servers $110_{1-3}$, $120_{1-3}$, in the system, if required.

As is illustrated in FIG. 2, the distributed database system 105 can be installed on more than one host $210_{1-3}$. Each host $210_{1-3}$ is a machine that can comprise at least one data processor (e.g., a CPU, etc.), memory, storage, a network interface, and an operation system and which executes part of the database system 105. Each host $210_{1-3}$ can execute a database instance $220_{1-3}$ which comprises the set of components of the distributed database system 105 that are installed on one host $210_{1-3}$. FIG. 2 shows a distributed system with three hosts, which each run a name server $110_{1-3}$, index server $120_{1-3}$, and so on (other components are omitted to simplify the illustration).

Figure 3:
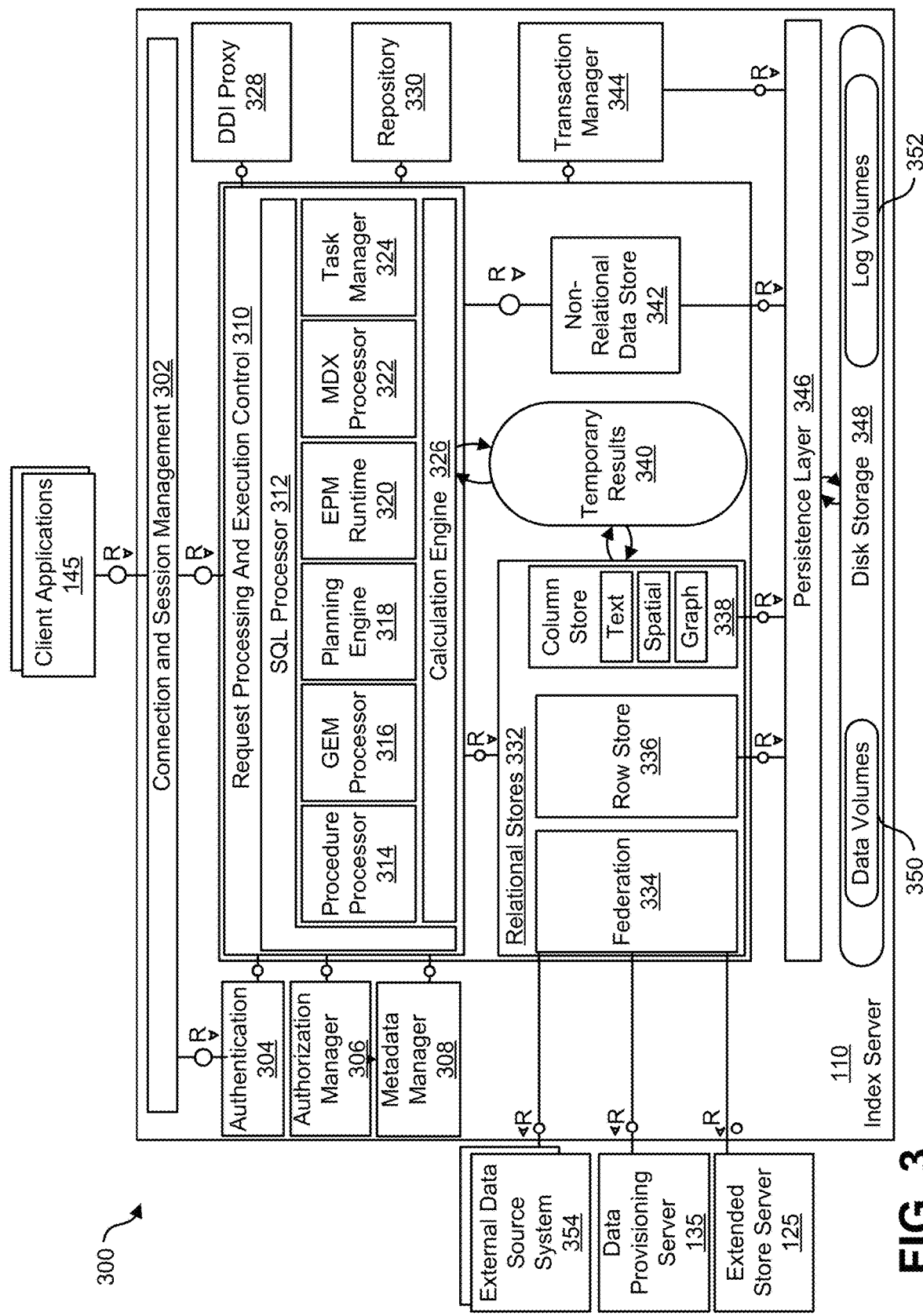
FIG. 3 is a diagram illustrating an architecture for an index server for use in connection with the current subject matter.

FIG. 3 is a diagram 300 illustrating an architecture for the index server 110 (which can, as indicated above, be one of many instances). A connection and session management component 302 can create and manage sessions and connections for the client applications 145. For each session, a set of parameters can be maintained such as, for example, auto commit settings or the current transaction isolation level.

Requests from the client applications 145 can be processed and executed by way of a request processing and execution control component 310. The database system 105 offers rich programming capabilities for running application-specific calculations inside the database system. In addition to SQL, MDX, and WIPE, the database system 105 can provide different programming languages for different use cases. SQLScript can be used to write database procedures and user defined functions that can be used in SQL statements. The L language is an imperative language, which can be used to implement operator logic that can be called by SQLScript procedures and for writing user-defined functions.

Once a session is established, client applications 145 typically use SQL statements to communicate with the index server 110 which can be handled by a SQL processor 312 within the request processing and execution control component 310. Analytical applications can use the multidimensional query language MDX (MultiDimensional eXpressions) via an MDX processor 322. For graph data, applications can use GEM (Graph Query and Manipulation) via a GEM processor 316, a graph query and manipulation language. SQL statements and MDX queries can be sent over the same connection with the client application 145 using the same network communication protocol. GEM statements can be sent using a built-in SQL system procedure.

The index server 110 can include an authentication component 304 that can be invoked with a new connection with a client application 145 is established. Users can be authenticated either by the database system 105 itself (login with user and password) or authentication can be delegated to an external authentication provider. An authorization manager 306 can be invoked by other components of the database system 105 to check whether the user has the required privileges to execute the requested operations.

Each statement can be processed in the context of a transaction. New sessions can be implicitly assigned to a new transaction. The index server 110 can include a transaction manager 344 that coordinates transactions, controls transactional isolation, and keeps track of running and closed transactions. When a transaction is committed or rolled back, the transaction manager 344 can inform the involved engines about this event so they can execute necessary actions. The transaction manager 344 can provide various types of concurrency control and it can cooperate with a persistence layer 346 to achieve atomic and durable transactions.

Incoming SQL requests from the client applications 145 can be received by the SQL processor 312. Data manipulation statements can be executed by the SQL processor 312 itself. Other types of requests can be delegated to the respective components. Data definition statements can be dispatched to a metadata manager 306, transaction control statements can be forwarded to the transaction manager 344, planning commands can be routed to a planning engine 318, and task related commands can forwarded to a task manager 324 (which can be part of a larger task framework). Incoming MDX requests can be delegated to the MDX processor 322. Procedure calls can be forwarded to the procedure processor 314, which further dispatches the calls, for example to a calculation engine 326, the GEM processor 316, a repository 300, or a DDI proxy 328.

The index server 110 can also include a planning engine 318 that allows planning applications, for instance for financial planning, to execute basic planning operations in the database layer. One such basic operation is to create a new version of a data set as a copy of an existing one while applying filters and transformations. For example, planning data for a new year can be created as a copy of the data from the previous year. Another example for a planning operation is the disaggregation operation that distributes target values from higher to lower aggregation levels based on a distribution function.

The SQL processor 312 can include an enterprise performance management (EPM) runtime component 320 that can form part of a larger platform providing an infrastructure for developing and running enterprise performance management applications on the database system 105. While the planning engine 318 can provide basic planning operations, the EPM platform provides a foundation for complete planning applications, based on by application-specific planning models managed in the database system 105.

The calculation engine 326 can provide a common infrastructure that implements various features such as SQLScript, MDX, GEM, tasks, and planning operations. The SQLScript processor 312, the MDX processor 322, the planning engine 318, the task manager 324, and the GEM processor 316 can translate the different programming languages, query languages, and models into a common representation that is optimized and executed by the calculation engine 326. The calculation engine 326 can implement those features using temporary results 340 which can be based, in part, on data within the relational stores 332.

Metadata can be accessed via the metadata manager component 306. Metadata, in this context, can comprise a variety of objects, such as definitions of relational tables, columns, views, indexes and procedures. Metadata of all these types can be stored in one common database catalog for all stores. The database catalog can be stored in tables in a row store 336 forming part of a group of relational stores 332. Other aspects of the database system 105 including, for example, support and multi-version concurrency control can also be used for metadata management. In distributed systems, central metadata is shared across servers and the metadata manager 306 can coordinate or otherwise manage such sharing.

The relational stores 332 form the different data management components of the index server 110 and these relational stores can, for example, store data in main memory. The row store 336, a column store 338, and a federation component 334 are all relational data stores which can provide access to data organized in relational tables. The column store 338 can store relational tables column-wise (i.e., in a column-oriented fashion, etc.). The column store 338 can also comprise text search and analysis capabilities, support for spatial data, and operators and storage for graph-structured data. With regard to graph-structured data, from an application viewpoint, the column store 338 could be viewed as a non-relational and schema-flexible in-memory data store for graph-structured data. However, technically such a graph store is not a separate physical data store. Instead, it is built using the column store 338, which can have a dedicated graph Application Program Interface (API).

The row store 336 can store relational tables row-wise. When a table is created, the creator can specify whether it should be row or column-based. Tables can be migrated between the two storage formats. While certain SQL extensions are only available for one kind of table (such as the "merge" command for column tables), standard SQL can be used on all tables. The index server 110 also provides functionality to combine both kinds of tables in one statement (join, sub query, union).

The federation component 334 can be viewed as a virtual relational data store. The federation component 334 can provide access to remote data in external data source system(s) 354 through virtual tables, which can be used in SQL queries in a fashion similar to normal tables.

The database system 105 can include an integration of a non-relational data store 342 into the index server 110. For example, the non-relational data store 342 can have data represented as networks of C++ objects, which can be persisted to disk. The non-relational data store 342 can be used, for example, for optimization and planning tasks that operate on large networks of data objects, for example in supply chain management. Unlike the row store 336 and the column store 338, the non-relational data store 342 does not use relational tables; rather, objects can be directly stored in containers provided by the persistence layer 346. Fixed size entry containers can be used to store objects of one class. Persisted objects can be loaded via their persisted object IDs, which can also be used to persist references between objects. In addition, access via in-memory indexes is supported. In that case, the objects need to contain search keys. The in-memory search index is created on first access. The non-relational data store 342 can be integrated with the transaction manager 344 to extend transaction management with sub-transactions, and to also provide a different locking protocol and implementation of multi version concurrency control.

An extended store is another relational store that can be used or otherwise form part of the database system 105. The extended store can, for example, be a disk-based column store optimized for managing very big tables, which ones do not want to keep in memory (as with the relational stores 332). The extended store can run in an extended store server 125 separate from the index server 110. The index server 110 can use the federation component 334 to send SQL statements to the extended store server 125.

The persistence layer 346 is responsible for durability and atomicity of transactions. The persistence layer 346 can ensure that the database system 105 is restored to the most recent committed state after a restart and that transactions are either completely executed or completely undone. To achieve this goal in an efficient way, the persistence layer 346 can use a combination of write-ahead logs, shadow paging and save points. The persistence layer 346 can provide interfaces for writing and reading persisted data and it can also contain a logger component that manages a transaction log. Recovery log entries can be written in the persistence layer 346 (in recovery log volumes 352) explicitly by using log interface or implicitly when using the virtual file abstracting. The recovery log volumes 352 can include redo logs which specify database operations to be replayed whereas data volume 350 contains undo logs which specify database operations to be undone as well as cleanup logs of committed operations which can be executed by a garbage collection process to reorganize the data area (e.g., free up space occupied by deleted data etc.).

The persistence layer 346 stores data in persistent disk storage 348 which, in turn, can include data volumes 350 and/or transaction log volumes 352 that can be organized in pages. Different page sizes can be supported, for example, between 4 k and 16M. Data can be loaded from the disk storage 348 and stored to disk page wise. For read and write access, pages can be loaded into a page buffer in memory. The page buffer need not have a minimum or maximum size, rather, all free memory not used for other things can be used for the page buffer. If the memory is needed elsewhere, least recently used pages can be removed from the cache. If a modified page is chosen to be removed, the page first needs to be persisted to disk storage 348. While the pages and the page buffer are managed by the persistence layer 346, the in-memory stores (i.e., the relational stores 332) can access data within loaded pages.

Figure 4:
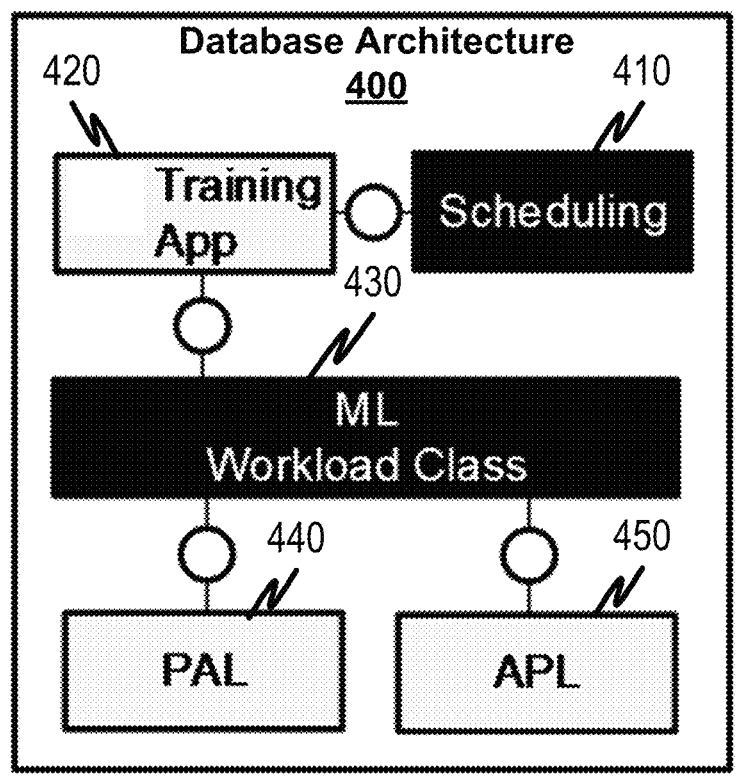
FIG. 4 depicts an example of a database architecture with an embedded ML functionality.

FIG. 4 depicts an example of a database architecture 400 with an embedded ML functionality. Database architecture 400 can be, for example, an in-memory database having embedded ML functionality. Database architecture 400 can include scheduling logic 410, a predictive analytics integrator (PAi) training application 420, a ML workload class 430, a predictive analytics library (PAL) 440, and an automated predictive library (APL) 450. Embedded ML inference calls made within database architecture 400 can be processed locally within database architecture 400 in real time. Training of the ML model can be run as a background task, which can consume system resources needed by the database architecture 400 to operate processes such as database queries. Scheduling training runs and limiting the number of parallel background jobs executing at the same time as the training can reduce the resource consumption of database architecture 400.

Scheduling logic 410 schedules automatic training at specified times. To schedule training, a recurrence pattern can be provided to define how often the automatic training occurs (e.g. a predetermined time such as weekly on Mondays or monthly on the 1$^{st}$). When training is scheduled, the system creates a scheduled instance which can contain object and schedule information. The scheduled instance, however, does not contain any data. When the system runs the training, it creates as an output, ML models. Event-based scheduling provides additional capability in terms of triggering training runs (e.g. if model accuracy decreases below a certain threshold then launch retraining).

There are a number of ways to restrict resource consumption within a database system having ML functionality (e.g., database architecture 400) during training of the ML models. In some variations, resource consumption can be restricted by reducing the number of parallel training jobs running at one time. For example, processing scheduled training runs in background jobs and limiting the number of parallel background jobs (e.g. #jobs <5). Scheduling logic 410 can also be integrated into the embedded training application 420.

Figure 5:
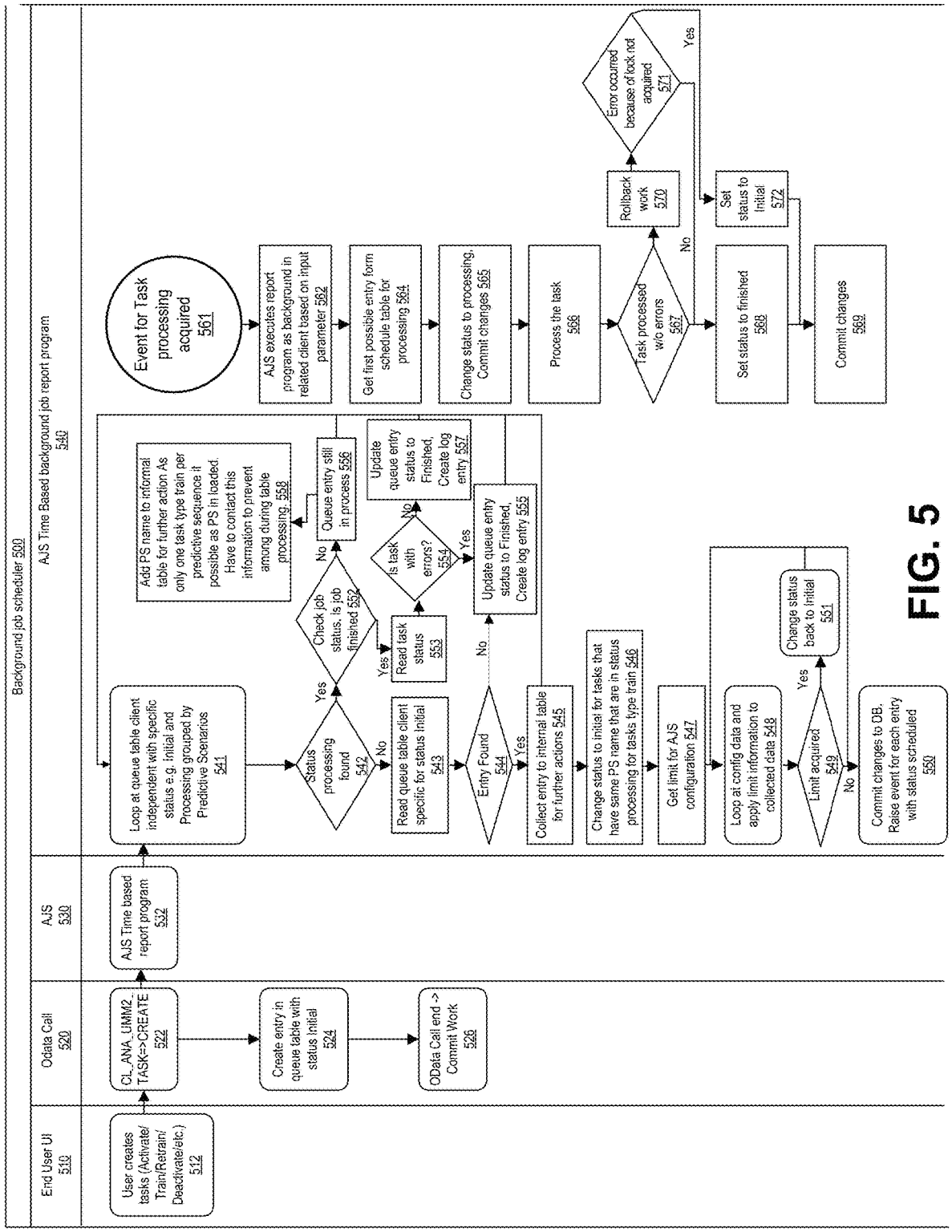
FIG. 5 is a process flow diagram illustrating example scheduling logic.

FIG. 5 is a process flow diagram illustrating example scheduling logic 410 (e.g., background job scheduler 500). Background job scheduler 500 can reduce the number of parallel training jobs running atone time. Using an end-user user interface (UI) 510, a user creates, at 512, a task. For example, a user can activate or deactivate a service or train or retrain a model. A software call can be generated, such as an open data protocol (odata) call 520, to reflect the user created task from 512. For example, an odata call such CL_ANA_UMM2_TASK=>CREATE 522 can be generated. With odata call 520, an entry in a queue table can be created, at 524, with a status of "Initial." Once the odata call 520 ends, the work for that particular task can be committed, at 526. Adaptive job server (AJS) 520 can generated a time based report program, at 532.

AJS time based background job report program 540 can execute a number of logic checks on the created task. In particular, a loop is executed, at 541, through a queue table client for tasks with a specific status (e.g., tasks having a status of "initial") and the processing is grouped by predictive scenarios. The status of the task is checked, at 542, to determine whether the task has a status of "processing" (e.g., that the task is running). If the tasks does not have a status of processing, the queue table client is read, at 543, for a status of "initial." A check is performed to see whether an entry is found, at 544, in the queue table client. If an entry is found, the entry is collected, at 545, to an internal table. The status of the task is changed, at 546, to "initial" for tasks that have the same predictive scenario (PS) name that are in status processing for tasks type train. A PS is a design time artifact that represents a ML use case and is the umbrella for all design time objects that are used for implementation of a ML use case. A limit for the AJS configurations is retrieved, at 547 (e.g., a limit of system resources). In other words, a user can configure a number of parallel jobs, CPU time, and/or the amount of memory and/or disk space that is permitted to be consumed by the computing system. These configurations are retrieved, at 547. The configuration data is looped through, at 548, and the limit information is applied to collected data. A check is performed, at 549, to determine whether the limit has been reached. If the limit has not yet been reached, the changes to the task are committed to a database, at 550. An event is raised for each entry with a status scheduled. If the limit has been reached, the status is changed, at 551, back to "initial," and the configuration data is continuously looped through.

If the status "processing" is found, at 542, the job status is checked, at 552, to determine whether the job is finished. If the job is finished, the task status is read, at 553. Whether the task has errors is evaluated, at 554. If the task has errors, the queue entry status is updated, at 555, to "finished" and a log entry is created. If the task does not have errors, the queue entry status is updated to "finished" and a log entry is created, at 557.

If the job status is checked but not finished, then the queue entry is still in process, at 556. A PS name is added to the informal table for further action, at 558, as only one task type train per predictive sequence is possible as PS in loaded.

An event task for processing is acquired, at 561, by the AJS time based background job report program. The AJS executes a report program background in related client based on input parameter, at 562. The first possible entry form schedule table for processing is retrieved, at 564. The task status is changed to "processing," at 565 and changes are committed. The task is then processed, at 566. A check is performed to determine whether the task was processing without errors, at 567. If the task is processing without errors, the work is rolled back. The root cause of the error is evaluated, at 571, to determine whether the error occurred because a lock was not acquired. If the error did not occur because a lock was not acquired, then the status of the task is set to "finished," at 568. The changes are committed, at 569. If the error did occur because a lock was not acquired, then the status of the task is set to "initial," at 572 and the changes are committed, at 569.

If the task was processed without errors, then the task status is set to finished, at 568. The changes are committed, at 569.

Figure 6:
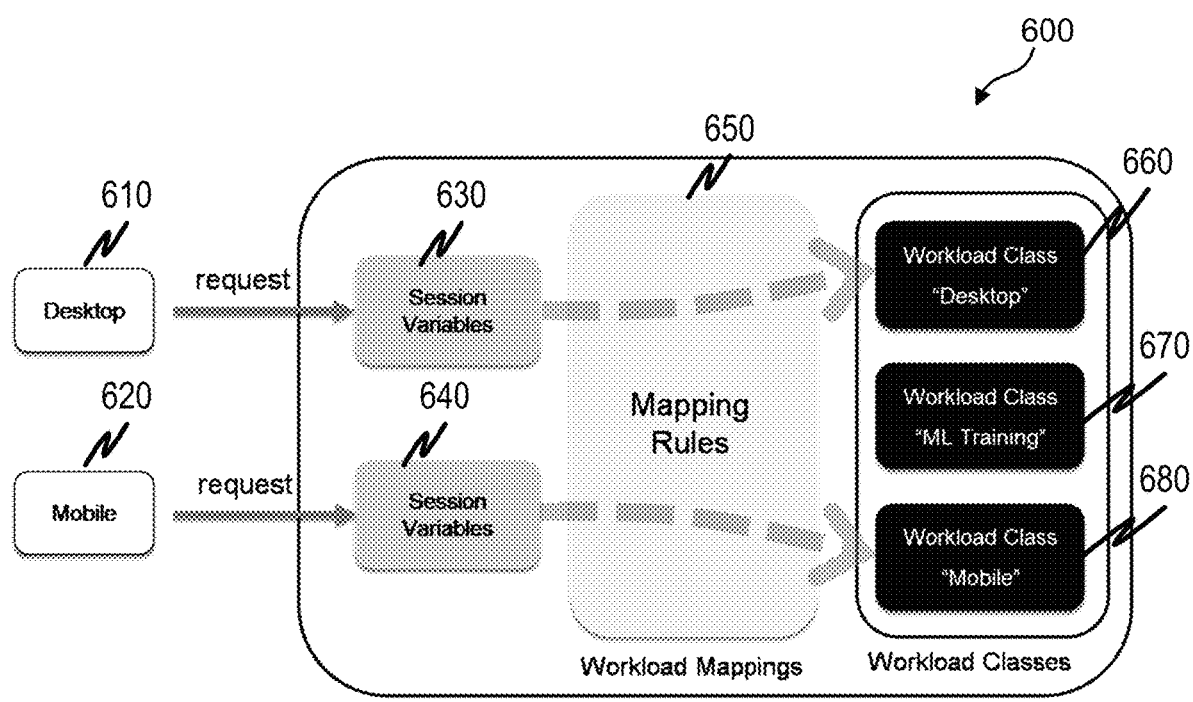
FIG. 6 depicts a process flow diagram using workload class and mapping technology.

Another way to reduce resource consumption during ML training can be to limit the memory and CPU-time usage by the ML algorithms. FIG. 6 depicts a process flow diagram 600 using workload class and mapping technology. The use of workload class and mapping can avoid overbooking system resources as CPU-time and memory through the use of pre-defined mapping rules. A user, such as a system administrator can define one or more workload classes (e.g., desktop workload classes 660, ML training workload classes 670, mobile workload classes 680). Each workload class can specify the amount of system resources that can be exploited by group of belonging applications. A series of workload mapping rules 650 can specify how to match an application workload with a corresponding workload class. When a request from an application (e.g., a request via a desktop application 610 or a mobile application 620) arrives at session layer of a database system, the corresponding workload class can be determined based on the information of session context. More specifically, each request has corresponding session variables 630, 640, e.g. application name, application user name, database user name. Once the corresponding workload class (e.g., desktop workload class 660, ML training workload class, mobile workload class) can be determined, the application request (e.g., from either a desktop application 610 or mobile application 620) can have its resource regulation according to workload class definition.

The workload class (e.g., desktop workload class 660, ML training workload class 670, mobile workload class 680) supports three kinds of resource properties to regulate: statement thread limit, statement memory limit, and statement priority. The statement thread limit represents the maximal number of parallel threads (more specifically basis job executors) to execute a statement while the statement memory limit represents max amount of memory allocated per statement. The statement priority represents the execution priority for a statement to be executed in the basis job execution framework. All properties regulations can be considered by the basis job framework.

FIG. 7 illustrates example coding of how workload classes are applied on an embedded ML algorithm. A temporary table with parameters can be setup using code 710. A random decision trees algorithm can be called using code 720. Configuration parameters can be established to limit statement memory using code 730. A simple workload class on statement timeout can be created using code 740 and a mapping can be made on the user name using code 750. The random decision tree algorithm can then be checked to see if the timeout is triggered using code 760.

Figure 8:
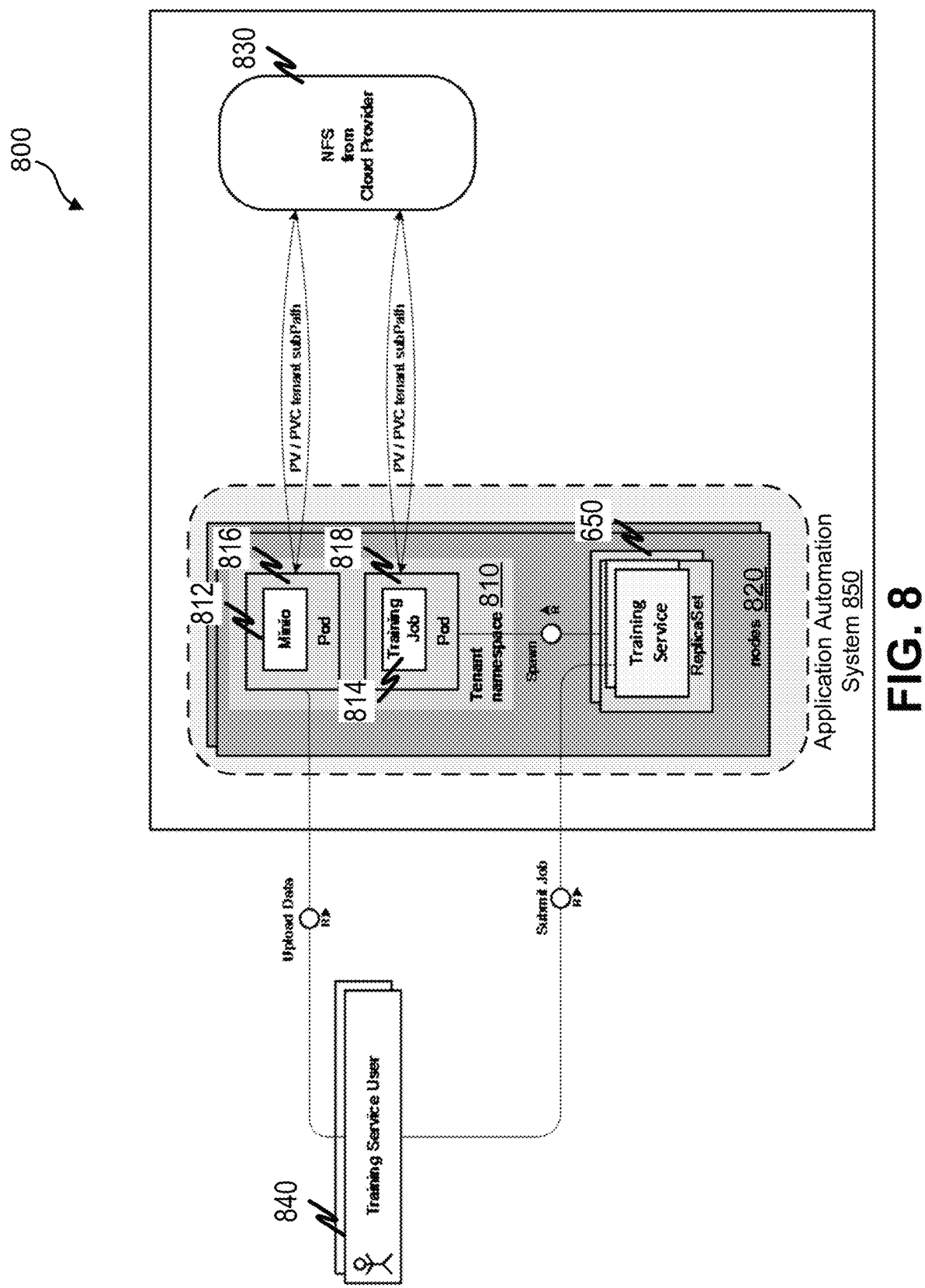
FIG. 8 depicts an example system architecture for providing a scalable interface and training infrastructure.

FIG. 8 depicts an example system architecture 800 for providing a scalable interface and training infrastructure. Scalability means the degree to which a business scenario, component, or system can be expanded or reduced in size, volume, or number of users served and still continue to function properly and predictably. In other words, scalability refers to the predictable resource consumption of a software application under different system loads (e.g., increasing multiuser or parallel load), while keeping response time within a reasonable range.

Application automation system 850 automates the deployment, scaling, maintenance, scheduling, and/or operation of multiple application containers across clusters of nodes. For example, containers run on top of a common shared operating system on host machines but are isolated from each other unless a user chooses to connect them. Application automation system 850 can be used with container runtimes as well as with the container runtime interface. It contains tools for orchestration, secrets management, service discovery, scaling, and/or load balancing. Application automation system 850 includes automatic bin packing to place containers with the optimal resources for the job, and it applies configurations via configuration management features. Application automation system 850 protects container workloads by rolling out or rolling back changes and offers availability and quality checks for containers. With application automation system 850, containers such as minio 812 and training job 814 run in pods 816, 818, which are the basic scheduling unit for application automation system 850, and which add a layer of abstraction to containers such as minio 812 and training job 814. Pods 816, 818 together make up a tenant namespace 810. Pods 816, 818 include one or more containers located on a host machine, and can share resources. Application automation system 850 identifies a machine having enough free compute capacity for a given pod 816, 818 and launches the associated containers. To avoid conflicts, each pod 816, 818 is assigned an unique internet protocol (IP) address, enabling applications to use ports. A node agent manages the pods 816, 818, its associated containers 812, 814, and its images. A node 820, also known as a minion, is a worker machine in application automation system 850. Node 820 can be either a physical machine or a virtual machine. Nodes 820 have the necessary services to run pods 816, 818 and receive management instructions from master components. Services found on nodes 816, 818 can, for example, include a docker, a proxy, and/or a node agent.

Tenant namespaces 810 and content can be easily deployed. A tenant ID and related configuration associated with the tenant namespace 810 can be injected into existing software architectures. Feature flags and/or cloud provider differences which interface (e.g., cloud provider 830) with application automation system 850 can be handled. Templating can be provided for creating application automation system 850 job specifications. Mounting of tenant data and access to graphical processing units (GPUs) can be enabled. Users have no direct access to application automation system 850. Instead, training service user 840 can upload data and/or submit job.

FIG. 9 illustrates example code for configuring resource consumption. Such resource consumption can include CPU, GPU, and/or memory. Training service can use a YAML/JSON file format as depicted in FIG. 9.

Figure 10:
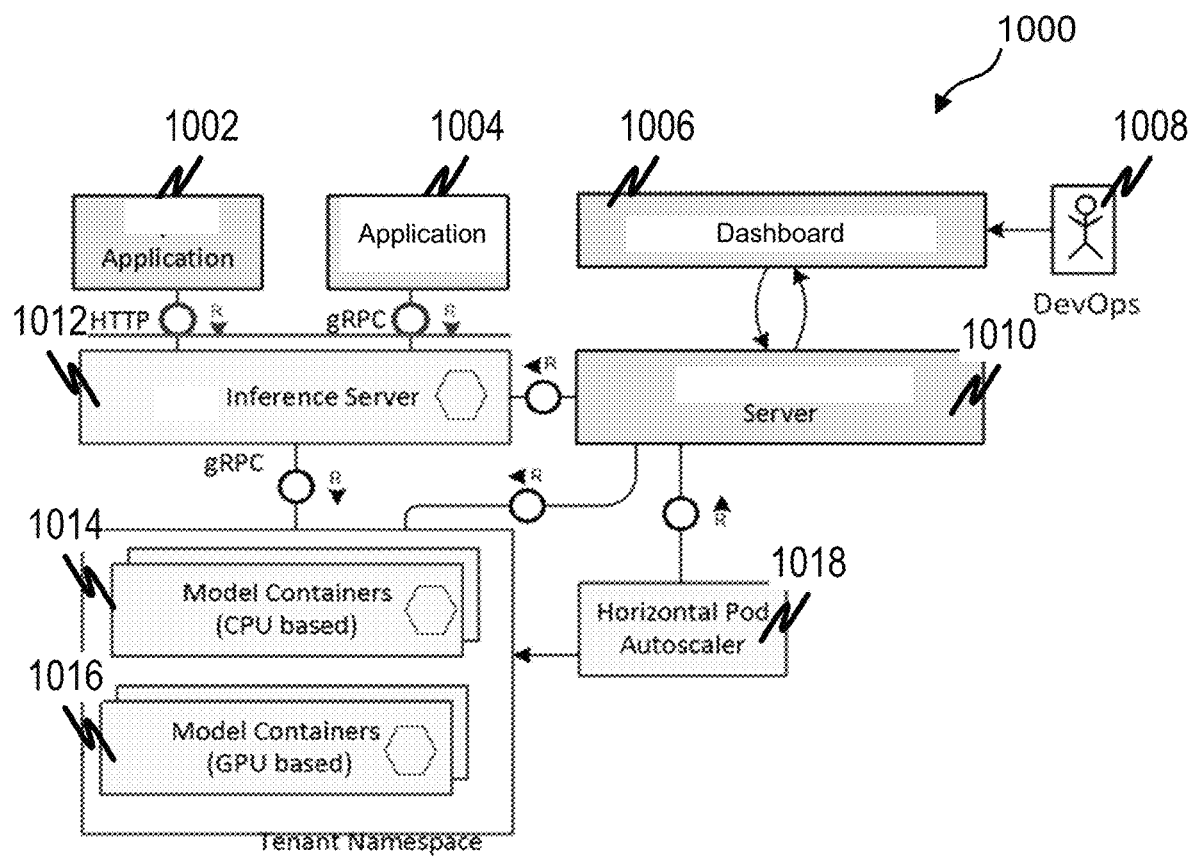
FIG. 10 depicts an example system architecture for inference.

FIG. 10 depicts an example system architecture 1000 for inference. As illustrated in FIG. 10, system architecture 1000 can include one or more applications 1002, 1004, dashboard 1006, server 1010, inference service 1012, one or more model containers 1014 which can be CPU based, and one or more model containers 1016 which are GPU based, and a horizontal pod autoscaler 1018. Depending on the workload of the system, the number of deployed inference servers 1012 can be modified so that optimal response time for requests and elastic workload management can be achieved. Performance of remote ML consumption should be high as mass transactional processes can be involved with the use of databases, such as in-memory databases. Inference results can be cached on the server side to improve response time, as described in FIG. 11 below. Bulking of inference calls can be helpful in terms of combining multiple requests in one inference call. With the in-memory database, inference results could be cached by having batch jobs making the results in advance for local consumption available. Specific types of the side-by-side trained models, such as the model illustrated in FIG. 11, could be also imported in an in-memory database and could be consumed locally, improving performance of inference calls dramatically as local APIs can be approximately 10-100 faster than remote APIs.

Figure 11:
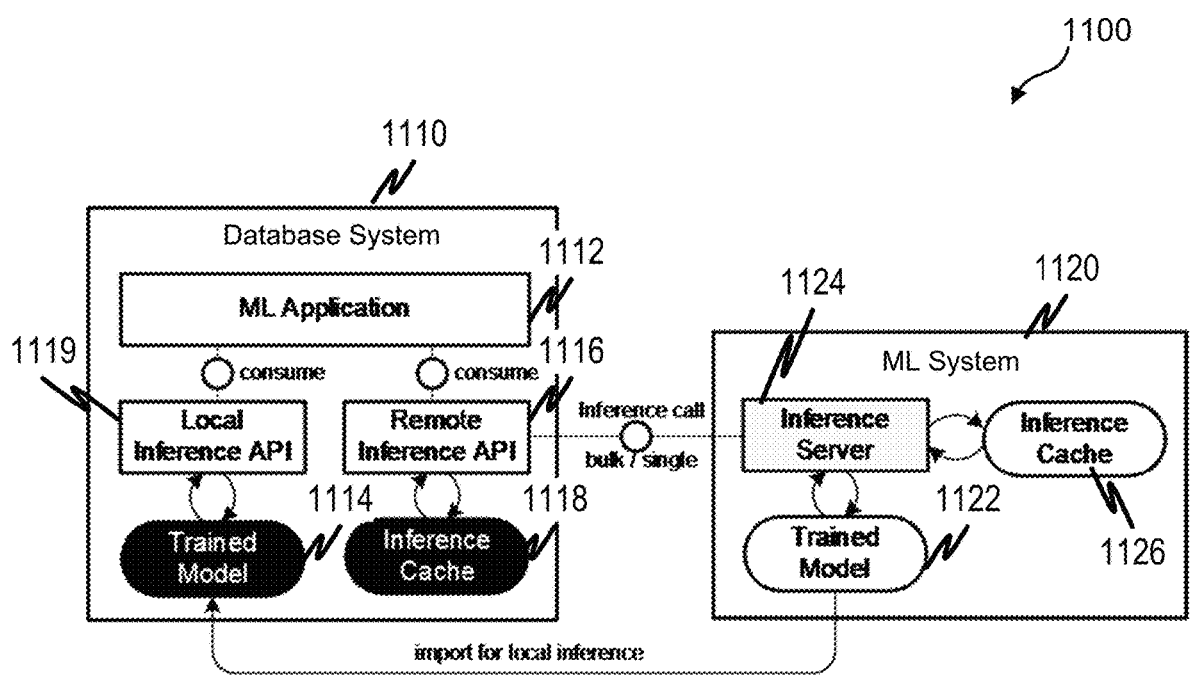
FIG. 11 depicts an example software architecture of a side-by-side system having a database system and a ML system.

FIG. 11 depicts an example software architecture of a side-by-side system 1100 having a database system 1110 and a ML system 1120. In some variations, a database system 1110, such as an in-memory database as described in FIGS. 1-3, can include an application that consumes a machine learning model or a ML application 1112. The consumed ML model may be trained by a ML program 1120. ML system 1120 generates and/or trains a ML model (e.g., trained ML model 1122). Database 1100 can make a remote call (e.g., inference call) to receive a predicted output to one or more requests from a trained ML model 1122 of a ML system 1120. Making a remote call to obtain predictions can be a resource intensive task due to a variety of factors such as establishing connectivity between the database system 1110. Using the architecture in FIG. 11, there are a number of ways to reduce the resource consumption.

In one variation, a remote inference call can be made by the database system 1110 to the ML system 1120. This remote inference call can be received by an inference server 1124, for the initial inference call, the trained ML model 1122 can calculate the result, and provide this back to database system 1110. The result can also be locally be cached within the ML system 1120 in an inference cache 1126. By caching the inference call within the ML system 1120, the ML system 1120 does not need to recalculate subsequent inference calls made by the database system 1110, thus minimizing the resource consumption of the ML system 1120 along with a response time to the inference call.

In another variation, bulking can be used to reduce resource consumption. More specifically, one or more remote application programming interfaces (APIs) 1116 can be defined. The remote API 1116 can collect a number of inference calls from the ML application 1112. After collecting a set number of inference calls (e.g., any number of inference calls that can decrease resource consumption such as 10, 100, 1000, 10000), a single bulk call can be made to the ML system 1120 for retrieval of the data specified in the number of inference calls. In other words, instead of sending individual inference calls for each request from the ML application 1112, the inference calls can be bulked together into a single call. The trained ML model 1122 can generate predications for all of the inference calls within the bulked call and provide back an output to the database system 1110.

In yet another variation, the inference results can be locally cached within the database system 1110 by the remote API 1116.

Yet another variation for reducing resource consumption, a trained ML model 1122 of ML system 1120 can be imported locally into database system 1110 (e.g., trained ML model 1114). Local inference APIs 1119 can be generated for processing inference calls from the ML application 1112 for predictions outputs of the imported trained ML model 1114. By using a locally imported trained ML model 1114, the amount of resources used by the database system 1110 can decrease and/or overall processing time can be decreased as any additional processing time added through the use of a remote inference call to the ML 1120 is avoided.

It can be appreciated that each of the techniques described in FIG. 11 can be used independently or in any combination with one another.

Figure 12:
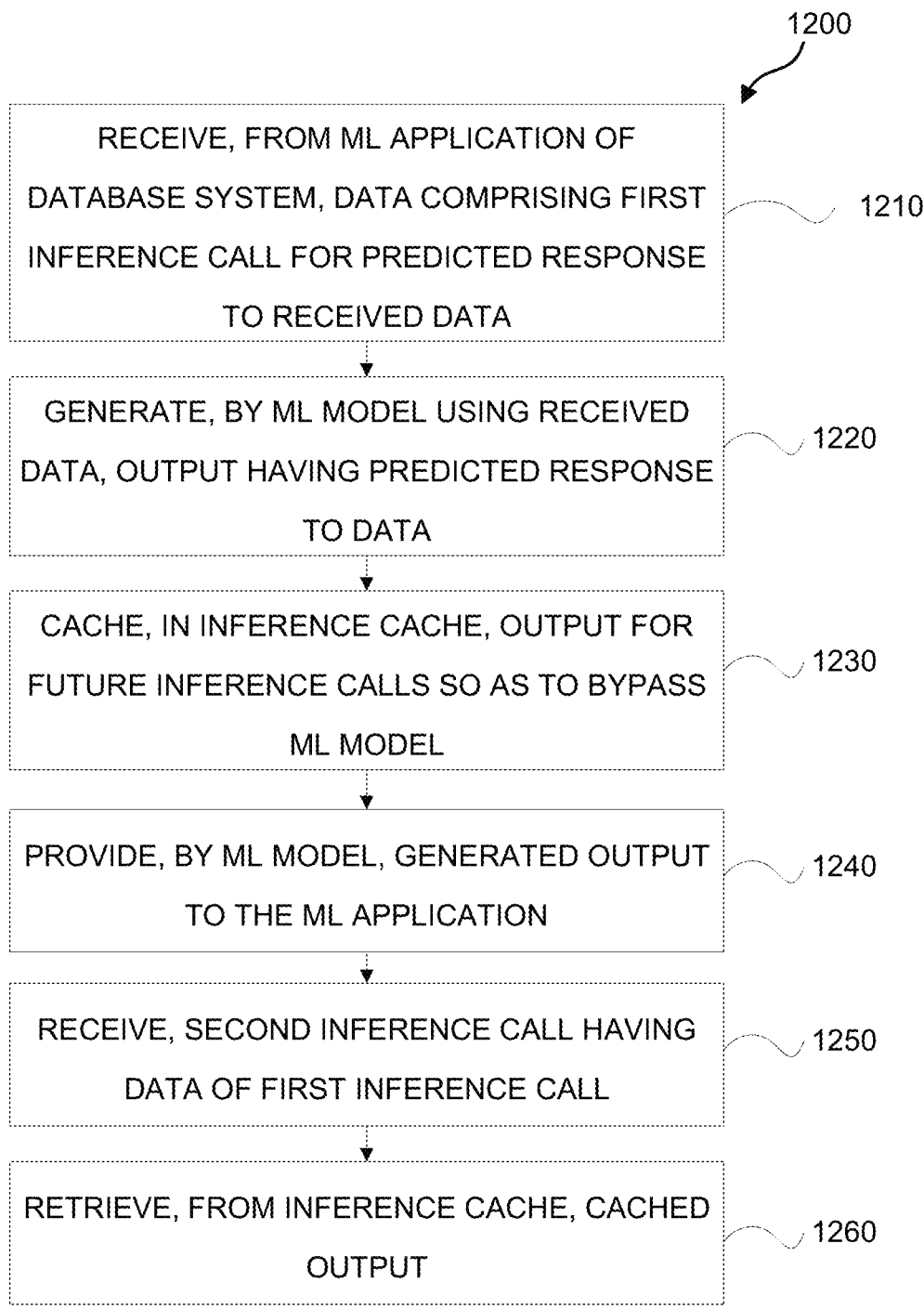
FIG. 12 depicts a process flow diagram for reducing resource consumption of a side-by-side database and ML systems.

FIG. 12 depicts a process flow diagram 1200 for reducing resource consumption of a side-by-side database and ML systems. Data is received, at 1210, from a ML application of a database system. The data includes a first inference call for a predicted response to data. The first inference call is a request to a ML model to generate one or more predictions for which a response is unknown. An output is generated, at 1220, by a ML model using the received data. The output includes the predicted response to the data. The output is cached, at 1230, in an inference cache for future inference calls so as to bypass the ML model. The generated output is provided, at 1240, by the ML model, to the ML application. A second inference call is received, at 1250. The second inference call includes the same data as the first inference call. The cached output is retrieved, at 1260, from the inference cache so as to bypass the ML model.

Figure 13:
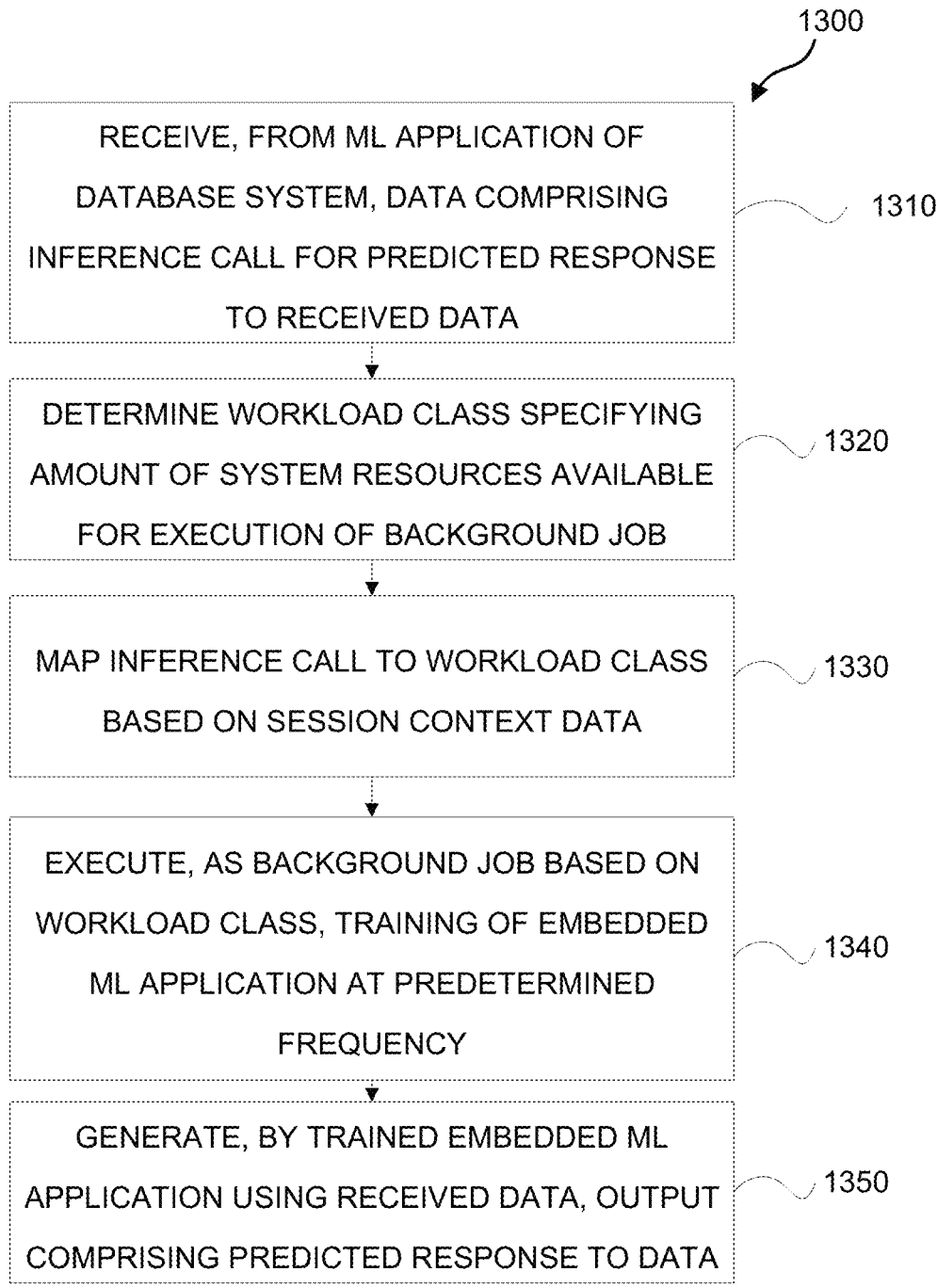
FIG. 13 depicts a process flow diagram for reducing resource consumption of a database system with embedded ML functionality.

FIG. 13 depicts a process flow diagram 1300 for reducing resource consumption of a database system with an embedded ML application. An embedded ML application receives, at 1310, data having an inference call for a predicted response to the received data. The inference call is a request to a ML model to generate one or more predictions for which a response is unknown and the inference call includes session context data. A workload class specifying an amount of system resources available for execution of the background job is determined, at 1320. The inference call is mapped, at 1330, to the workload class based on the session context data. Based on the workload class, training of the embedded ML application is executed, at 1340, as a background job at predetermined frequency. A number of background jobs running in parallel with the training is minimized using the scheduling techniques described in FIG. 5. The trained embedded ML application generates, at 1350, using the received data, an output comprising the predicted response to the data.

One or more aspects or features of the subject matter described herein can be realized in digital electronic circuitry, integrated circuitry, specially designed application specific integrated circuits (ASICs), field programmable gate arrays (FPGAs) computer hardware, firmware, software, and/or combinations thereof. These various aspects or features can include implementation in one or more computer programs that are executable and/or interpretable on a programmable system including at least one programmable processor, which can be special or general purpose, coupled to receive data and instructions from, and to transmit data and instructions to, a storage system, at least one input device, and at least one output device. The programmable system or computing system can include clients and servers. A client and server are generally remote from each other and typically interact through a communication network. The relationship of client and server arises by virtue of computer programs running on the respective computers and having a client-server relationship to each other.

These computer programs, which can also be referred to as programs, software, software applications, applications, components, or code, include machine instructions for a programmable processor, and can be implemented in a high-level procedural language, an object-oriented programming language, a functional programming language, a logical programming language, and/or in assembly/machine language. As used herein, the term "computer-readable medium" refers to any computer program product, apparatus and/or device, such as for example magnetic discs, optical disks, memory, and Programmable Logic Devices (PLDs), used to provide machine instructions and/or data to a programmable processor, including a computer-readable medium that receives machine instructions as a computer-readable signal. The term "computer-readable signal" refers to any signal used to provide machine instructions and/or data to a programmable processor. The computer-readable medium can store such machine instructions non-transitorily, such as for example as would a non-transient solid-state memory or a magnetic hard drive or any equivalent storage medium. The computer-readable medium can alternatively or additionally store such machine instructions in a transient manner, for example as would a processor cache or other random access memory associated with one or more physical processor cores.

Figure 14:
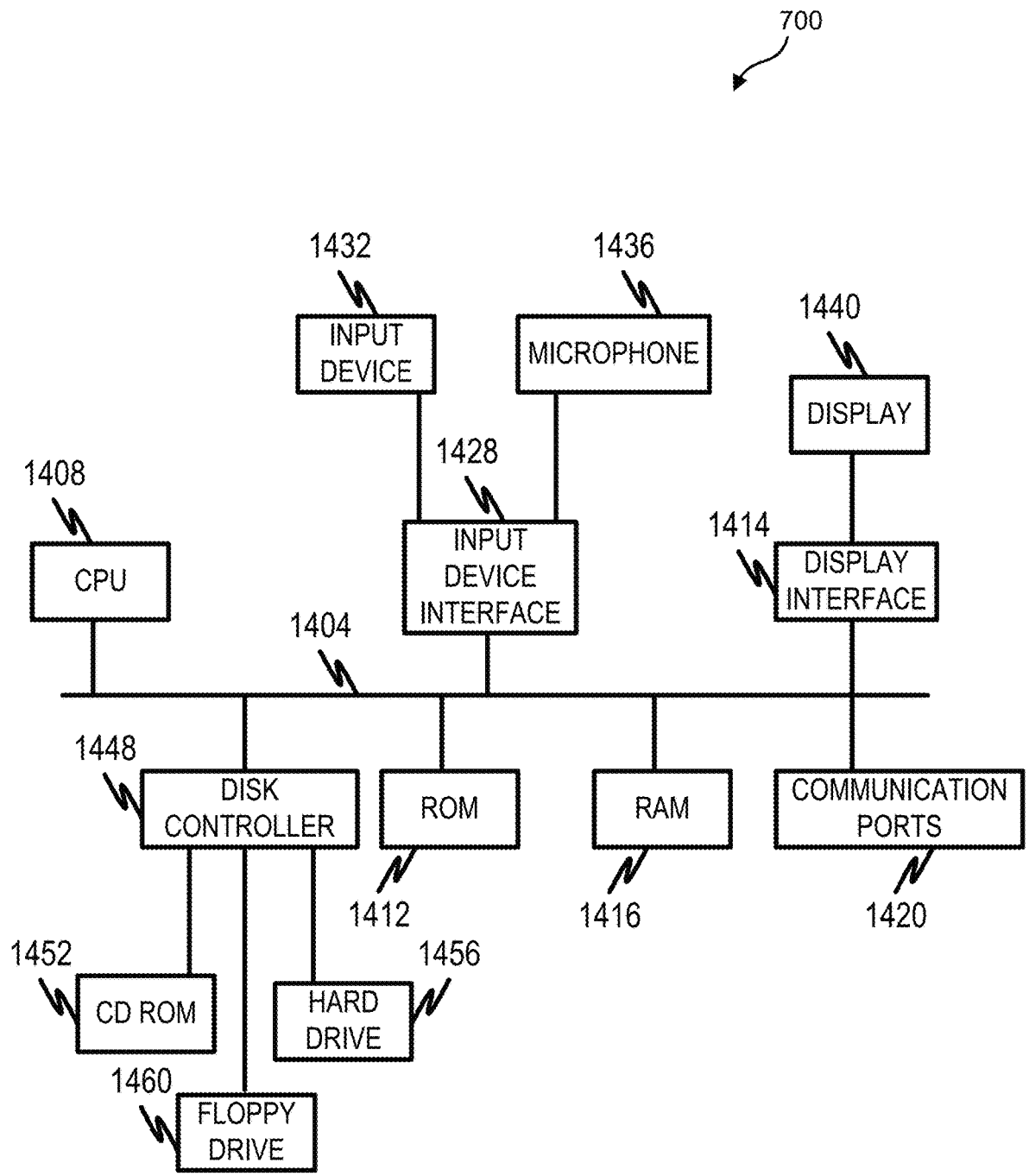
FIG. 14 is a diagram illustrating a sample computing device architecture for implementing various aspects described herein.

FIG. 14 is a diagram 140 illustrating a sample computing device architecture for implementing various aspects described herein. A bus 144 can serve as the information highway interconnecting the other illustrated components of the hardware. A processing system 1408 labeled CPU (central processing unit) (e.g., one or more computer processors/data processors at a given computer or at multiple computers), can perform calculations and logic operations required to execute a program. A non-transitory processor-readable storage medium, such as read only memory (ROM) 1412 and random access memory (RAM) 1416, can be in communication with the processing system 1408 and can include one or more programming instructions for the operations specified here. Optionally, program instructions can be stored on a non-transitory computer-readable storage medium such as a magnetic disk, optical disk, recordable memory device, flash memory, or other physical storage medium.

In one example, a disk controller 1448 can interface one or more optional disk drives to the system bus 1404. These disk drives can be external or internal floppy disk drives such as 1460, external or internal CD-ROM, CD-R, CD-RW or DVD, or solid state drives such as 1452, or external or internal hard drives 1456. As indicated previously, these various disk drives 1452, 1456, 1460 and disk controllers are optional devices. The system bus 1404 can also include at least one communication port 1420 to allow for communication with external devices either physically connected to the computing system or available externally through a wired or wireless network. In some cases, the communication port 1420 includes or otherwise comprises a network interface.

To provide for interaction with a user, the subject matter described herein can be implemented on a computing device having a display device 1440 (e.g., a CRT (cathode ray tube) or LCD (liquid crystal display) monitor) for displaying information obtained from the bus 1404 to the user and an input device 1432 such as keyboard and/or a pointing device (e.g., a mouse or a trackball) and/or a touchscreen by which the user can provide input to the computer. Other kinds of input devices 1432 can be used to provide for interaction with a user as well; for example, feedback provided to the user can be any form of sensory feedback (e.g., visual feedback, auditory feedback by way of a microphone 1436, or tactile feedback); and input from the user can be received in any form, including acoustic, speech, or tactile input. In the input device 1432 and the microphone 1436 can be coupled to and convey information via the bus 1404 by way of an input device interface 1428. Other computing devices, such as dedicated servers, can omit one or more of the display 1440 and display interface 1414, the input device 1432, the microphone 1436, and input device interface 1428.

To provide for interaction with a user, the subject matter described herein can be implemented on a computer having a display device (e.g., a CRT (cathode ray tube) or LCD (liquid crystal display) monitor) for displaying information to the user and a keyboard and a pointing device (e.g., a mouse or a trackball) and/or a touchscreen by which the user can provide input to the computer. Other kinds of devices can be used to provide for interaction with a user as well; for example, feedback provided to the user can be any form of sensory feedback (e.g., visual feedback, auditory feedback, or tactile feedback); and input from the user can be received in any form, including acoustic, speech, or tactile input.

In the descriptions above and in the claims, phrases such as "at least one of" or "one or more of" may occur followed by a conjunctive list of elements or features. The term "and/or" may also occur in a list of two or more elements or features. Unless otherwise implicitly or explicitly contradicted by the context in which it is used, such a phrase is intended to mean any of the listed elements or features individually or any of the recited elements or features in combination with any of the other recited elements or features. For example, the phrases "at least one of A and B;" "one or more of A and B;" and "A and/or B" are each intended to mean "A alone, B alone, or A and B together." A similar interpretation is also intended for lists including three or more items. For example, the phrases "at least one of A, B, and C;" "one or more of A, B, and C;" and "A, B, and/or C" are each intended to mean "A alone, B alone, C alone, A and B together, A and C together, B and C together, or A and B and C together." In addition, use of the term "based on," above and in the claims is intended to mean, "based at least in part on," such that an unrecited feature or element is also permissible.

The subject matter described herein can be embodied in systems, apparatus, methods, and/or articles depending on the desired configuration. The implementations set forth in the foregoing description do not represent all implementations consistent with the subject matter described herein. Instead, they are merely some examples consistent with aspects related to the described subject matter. Although a few variations have been described in detail above, other modifications or additions are possible. In particular, further features and/or variations can be provided in addition to those set forth herein. For example, the implementations described above can be directed to various combinations and subcombinations of the disclosed features and/or combinations and subcombinations of several further features disclosed above. In addition, the logic flows depicted in the accompanying figures and/or described herein do not necessarily require the particular order shown, or sequential order, to achieve desirable results. Other implementations may be within the scope of the following claims.

What is claimed is:

1. A method for reducing resource consumption of a database and a machine learning (ML) system, the method implemented by one or more data processors forming part of at least one computing device and comprising:
receiving, during an inference time of the ML system, from a ML application of a database, data comprising a first inference call for a predicted response to the received data, wherein the first inference call is a request to a ML model to generate one or more predictions for which a response is unknown, the database including logic for accessing data stored in the database and being an in-memory database in which all data stored in the in-memory database is kept in main memory separate and distinct from any processor;
generating, by the ML model using the received data, an output comprising the predicted response to the data;
caching, in an inference cache, the output for future inference calls so as to bypass the ML model;
providing, by the ML model, the generated output to the ML application;
receiving a second inference call comprising the data of the first inference call; and
retrieving, from the inference cache, the cached output, wherein the retrieving bypasses the ML model.

2. The method of claim 1, further comprising:
importing, by the database, the ML model from the ML system, the ML system comprising a different computing device than the database,
wherein the output is generated after the importing such that the generating occurs within the database.

3. The method of claim 1, wherein the ML model is trained by the ML system and the ML system comprises the ML model and the inference cache.

4. The method of claim 1, wherein the ML model is trained by the ML system, the ML system comprises the ML model, and the database comprises the inference cache.

5. The method of claim 1, further comprising:
generating, by the ML application, data comprising a plurality of inference calls for a plurality of predicted responses to the data;
combining, by an application programming interface (API), the plurality of inference calls into a single bulk call, wherein the database comprises the API; and
providing, by the API, the single bulk call to the ML model.

6. The method of claim 1, wherein the received data is received by an inference server of the ML system.

7. The method of claim 6, wherein an application programming interface (API) provides the first inference call and the second inference call to the inference server.

8. The method of claim 1, wherein data in the inference cache is not persisted.

9. The method of claim 8, wherein data in the database is persisted.

10. A system for reducing resource consumption of a database and a machine learning (ML) system, the system comprising:
at least one data processor; and
memory storing instructions, which when executed by at least one data processor, result in operations comprising:
receiving, during an inference time of the ML system, from a ML application of a database, data comprising a first inference call for a predicted response to the received data, wherein the first inference call is a request to a ML model to generate one or more predictions for which a response is unknown, the database including logic for accessing data stored in the database and being an in-memory database in which all data stored in the in-memory database is kept in main memory separate and distinct from any processor;
generating, by the ML model using the received data, an output comprising the predicted response to the data;
caching, in an inference cache, the output for future inference calls so as to bypass the ML model;
providing, by the ML model, the generated output to the ML application;
receiving a second inference call comprising the data of the first inference call; and
retrieving, from the inference cache, the cached output, wherein the retrieving bypasses the ML model.

11. The system of claim 10, wherein the operations further comprise:
importing, by the database, the ML model from the ML system, the ML system comprising a different computing device than the database,
wherein the output is generated after the importing such that the generating occurs within the database.

12. The system of claim 10, wherein the ML model is trained by the ML system and the ML system comprises the ML model and the inference cache.

13. The system of claim 10, wherein the ML model is trained by the ML system, the ML system comprises the ML model, and the database comprises the inference cache.

14. The system of claim 10, wherein the operations further comprise:
generating, by the ML application, data comprising a plurality of inference calls for a plurality of predicted responses to the data;
combining, by an application programming interface (API), the plurality of inference calls into a single bulk call, wherein the database comprises the API; and
providing, by the API, the single bulk call to the ML model.

15. The system of claim 10, wherein the received data is received by an inference server of the ML system.

16. The system of claim 15, wherein an application programming interface (API) provides the first inference call and the second inference call to the inference server.

17. A method for reducing resource consumption of a database with an embedded machine learning (ML) application, the method comprising:
receiving, during an inference time, by the embedded ML application, data comprising an inference call for a predicted response to the received data, wherein the inference call is a request to a ML model to generate one or more predictions for which a response is unknown and the inference call comprises session context data, the database including logic for accessing data stored in the database and being an in-memory database in which all data stored in the in-memory database is kept in main memory separate and distinct from any processor;
determining a workload class specifying an amount of system resources available for execution of a background job;
mapping the inference call to a workload class based on the session context data;

executing, as a background job based on the workload class, training of the embedded ML application at predetermined frequency, wherein a number of background jobs running in parallel with the training is minimized; and generating, by the trained embedded ML application using the received data, an output comprising the predicted response to the data.

18. The method of claim 17, wherein first inference call includes at least one of an application name, an application user name, or a database user name.

19. The method of claim 17, further comprising:

scheduling execution of the training by:

receiving, by a scheduling application of the database, a task generated by a user, the task having an associated amount of system resources required for execution of the task;

generating, by the scheduling application, an entry in a queue table having a first status, the queue table have a plurality of entries;

evaluating, by the scheduling application, each entry of the plurality of entries of the queue table for the first status; and minimizing, by the scheduling application, execution of a number of parallel background jobs running in parallel based on the associated amount of system resources required for execution of the task and a current available amount of system resources.

* * * * *